US007190584B2

(12) United States Patent
Lee et al.

(10) Patent No.: US 7,190,584 B2
(45) Date of Patent: Mar. 13, 2007

(54) RETAINING DEVICE FOR HEAT SINK

(75) Inventors: Hsieh-Kun Lee, Tu-Cheng (TW);
Dong-Yun Li, Shenzhen (CN);
Hong-Bo Shi, Shenzhen (CN); Min Li,
Shenzhen (CN)

(73) Assignee: Hon Hai Precision Industry Co., Ltd.,
Tu-cheng (TW)

( * ) Notice: Subject to any disclaimer, the term of this patent is extended or adjusted under 35 U.S.C. 154(b) by 227 days.

(21) Appl. No.: 11/019,769

(22) Filed: Dec. 21, 2004

(65) Prior Publication Data

US 2005/0219824 A1 Oct. 6, 2005

(30) Foreign Application Priority Data

Mar. 17, 2004 (CN) .......................... 2004 2 0438963

(51) Int. Cl.
*H05K 7/20* (2006.01)
(52) U.S. Cl. ...................... 361/703; 361/704; 361/719; 257/718; 257/719; 165/80.3; 248/510
(58) Field of Classification Search ................ 361/687, 361/702, 703, 704, 705, 717–719; 257/718, 257/719, 722, 726, 727; 174/15.1, 15.2, 174/16.3; 165/80.3, 185; 248/316.7, 505, 248/510; 24/453, 457, 458, 625, 296; 428/40.1, 428/40.2, 41.9, 131, 137, 354; 29/832, 840
See application file for complete search history.

(56) References Cited

U.S. PATENT DOCUMENTS

| 6,061,239 | A | | 5/2000 | Blomquist | |
|---|---|---|---|---|---|
| 6,181,559 | B1 | * | 1/2001 | Seo | ............................. 361/704 |
| 6,332,251 | B1 | * | 12/2001 | Ho et al. | ....................... 24/459 |
| 6,449,152 | B1 | * | 9/2002 | Lin | ............................. 361/697 |
| 6,450,248 | B1 | * | 9/2002 | Chang | ........................ 165/80.3 |
| 6,507,491 | B1 | * | 1/2003 | Chen | ........................... 361/697 |
| 6,522,545 | B2 | * | 2/2003 | Shia et al. | ................... 361/704 |
| 6,525,941 | B1 | * | 2/2003 | Lai | ............................. 361/697 |
| 6,532,153 | B1 | * | 3/2003 | Chiu | ........................... 361/703 |
| 6,542,367 | B2 | * | 4/2003 | Shia et al. | ................... 361/703 |
| 6,822,864 | B2 | * | 11/2004 | Huang et al. | ................ 361/697 |
| 6,822,870 | B2 | * | 11/2004 | Hong et al. | .................. 361/704 |
| 6,934,153 | B2 | * | 8/2005 | Lee et al. | .................... 361/697 |
| 6,978,827 | B2 | * | 12/2005 | Armstrong | ................. 165/80.3 |

FOREIGN PATENT DOCUMENTS

TW 092220602 10/2004

* cited by examiner

*Primary Examiner*—Michael Datskovskiy
(74) *Attorney, Agent, or Firm*—Tim Tingkang Xia, Esq.; Morris, Manning & Marti

(57) ABSTRACT

A retainer (20) for a heat sink includes a supporting member (22), a bracket member (24), a pair of locking members (26) and an operating member (28). The supporting member defines a pair of openings (222) at opposite ends thereof. The bracket member is located above the supporting member and has a pair of abutting portions (246) extending therefrom. The locking members respectively pass through the openings of the supporting member and are pivotably attached to the bracket member. Each locking member has a spring portion (264) depressed on one of said abutting portions to maintain the locking member at a releasing position. The operating member is pivotable relative to the bracket member to cause the bracket member and the associated locking members to move upward and the supporting member to drive the locking members to turn toward each other to a locking position.

17 Claims, 5 Drawing Sheets

RETAINING DEVICE FOR HEAT SINK

TECHNICAL FIELD

The present invention relates generally to a retaining device, and more particularly to a retaining device which can conveniently mount a heat sink to an electronic device.

BACKGROUND

It is widely acknowledged that heat is produced during operations of electronic devices such as central processing units (CPUs) of computers. The heat produced must be quickly removed away to ensure the CPUs working normally. Typically, a cooling device such as a heat sink is provided to a CPU for dissipating heat from the CPU. In order to keep the heat sink into close contact with the CPU, a retaining device is generally required.

Up to now, many kinds of retaining devices have been developed. Conventional plate-type of clip was a popular one. The clip generally has a M-shaped configuration, which includes a V-shaped central pressing portion for pressing the heat sink against the CPU and two locking feet depending from the central pressing portion at opposite sides thereof. Each locking foot defines a retaining hole at a free end thereof for engaging with a corresponding catch of a socket connector on which the CPU is installed. An example of this kind of clip is shown in U.S. Pat. No. 6,301,112 B1. In assembly, the locking feet are required to expand outwardly to thereby allow the retaining holes of the locking feet to receive and engage with the catches of the socket connector. It is laborious and difficult to expand the locking feet since the clip has good rigidity. In addition, when large force is applied the locking feet are prone to slide over the catches of the socket connector to damage other electronic devices adjacent the CPU.

Cam-type of clip is another kind of retaining device widely used for mounting of a heat sink. FIG. 8 shows a pair of conventional cam-type clips 90 and a retention module 97. Each clip 90 comprises an integral M-shaped bracket 91 and a cam mechanism 92 pivotably attached to the bracket 91. The bracket 91 has a pair of locking feet 94 integrally formed at opposite ends thereof. Each locking foot 94 has a retaining hole 95 for retaining a corresponding catch 98 of the retention module 97. However, when the clip 90 is combined to the retention module 97, large force is still needed since the bracket 91 is integrally formed and accordingly has a large rigidity.

SUMMARY OF THE INVENTION

Accordingly, an object of the present invention is to provide a retaining device which can conveniently and firmly mount a heat sink to an electronic device.

In order to achieve the object set out above, a retaining device for a heat sink in accordance with the present invention comprises a supporting member, a bracket member, a pair of locking members and an operating member. The supporting member defines a pair of openings at opposite ends thereof. The bracket member is located above the supporting member and has a pair of abutting portions extending therefrom. The locking members respectively pass through the openings of the supporting member and are pivotably attached to the bracket member. Each locking member has a spring portion abutting against one of said abutting portions to maintain the locking member at a releasing position. The operating member is pivotably attached to the bracket member and is pivotable relative to the bracket member to cause the bracket member and the associated locking members to move upward and the supporting member to drive the locking members to turn toward each other to a locking position.

Other objects, advantages and novel features of the present invention will become more apparent from the following detailed description when taken in conjunction with the accompanying drawings, in which:

DETAILED DESCRIPTION OF PREFERRED EMBODIMENTS

Figure 1:
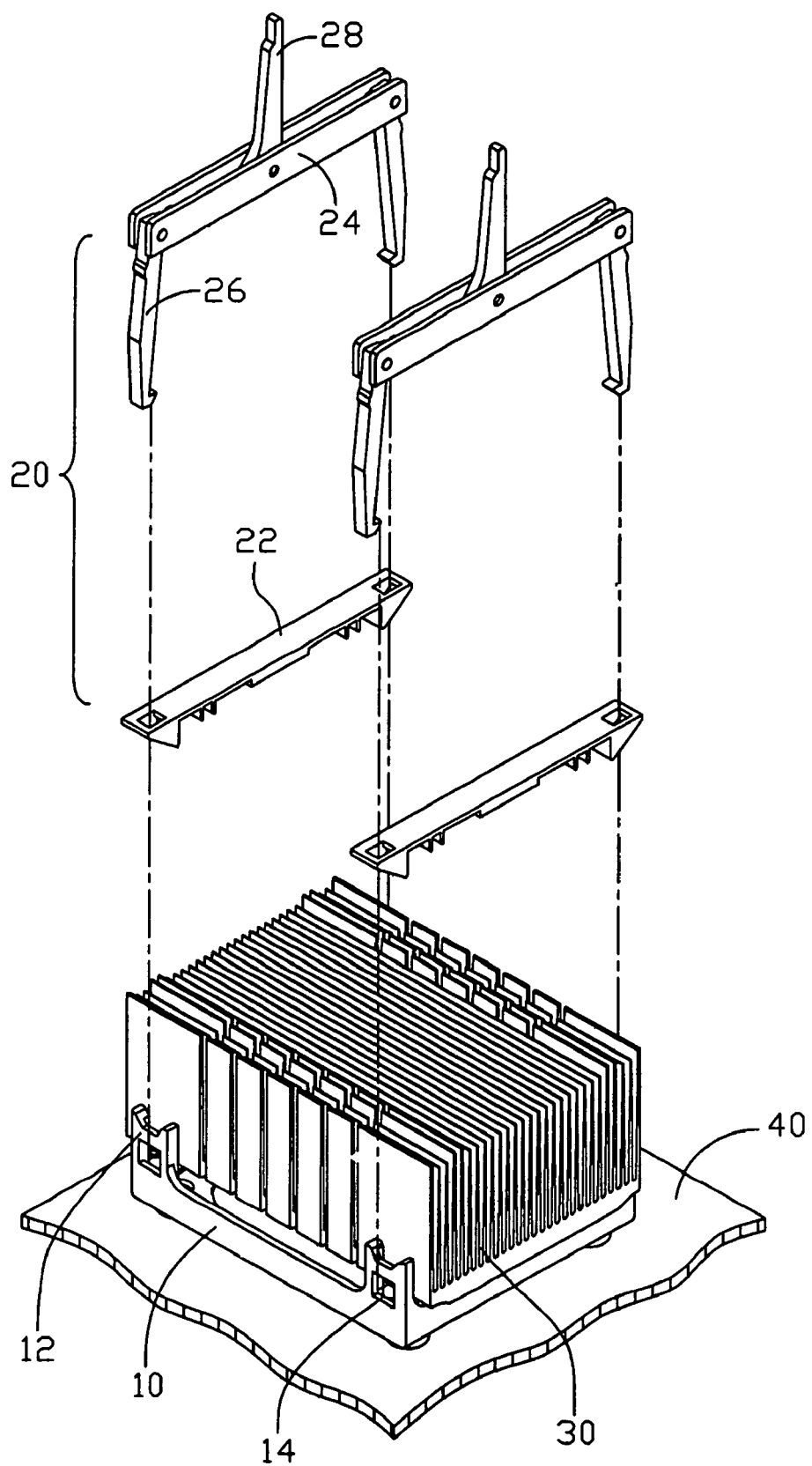
FIG. 1 is an isometric illustrating a retaining device according to a preferred embodiment of the present invention, together with a heat sink, a printed circuit board and a retention module.

Reference will now be made to the drawing figures to describe the present invention in detail.

FIG. 1 illustrates a retaining device according to a preferred embodiment of the present invention for securing a heat sink 30 to an electronic component like a CPU 50 (See FIG. 5) mounted on a printed circuit board (PCB) 40 on which a retention module 10 is mounted surrounding the CPU 50. The retaining device includes a pair of retainers 20. The retention module 10 has a frame configuration and includes four latching legs 12 extending respectively upwardly from four corners thereof. Each latching leg 12 defines a retaining hole 14. The heat sink 30 is seated on the CPU 50 and surrounded by the latching legs 12.

Figure 2:
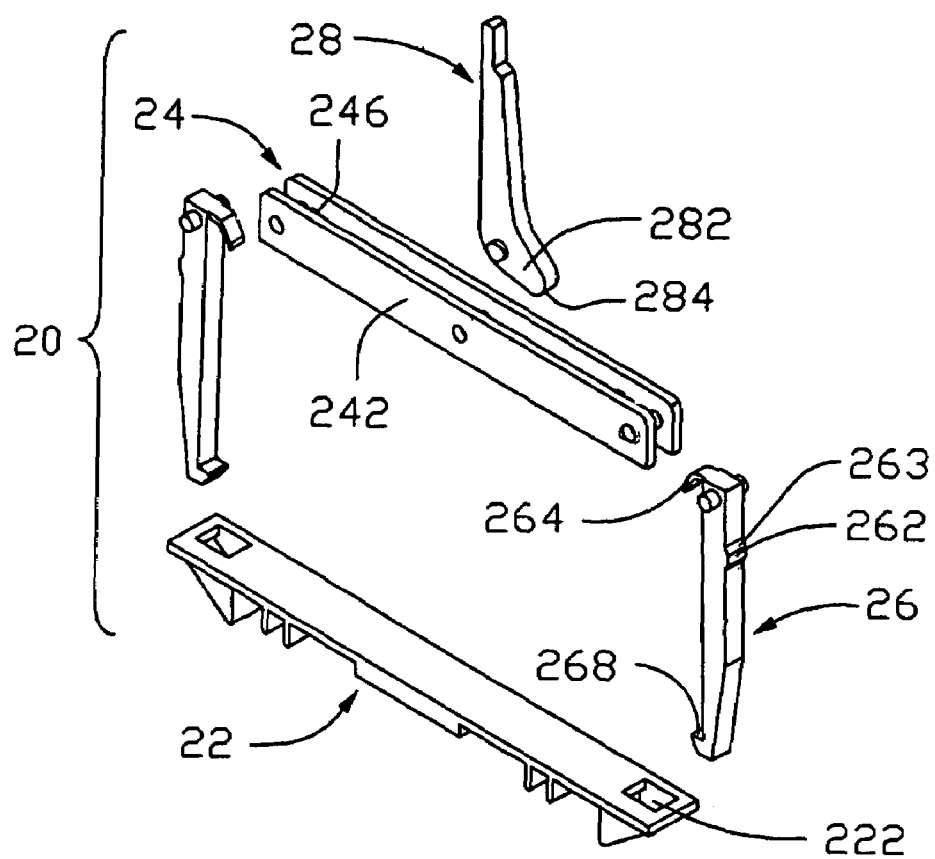
FIG. 2 is an exploded, isometric view of the retaining device of FIG. 1.
Figure 3:
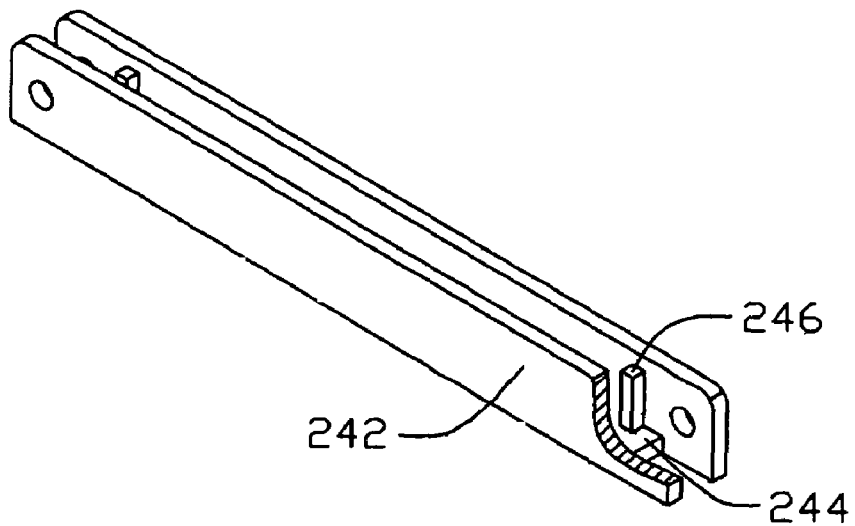
FIG. 3 is an isometric view of the bracket member in FIG. 2 with a portion thereof being cut away.

Referring to FIG. 2, each retainer 20 includes a supporting member 22, a bracket member 24, a pair of locking members 26 and an operating member 28. The supporting member 22 has a flat top surface and defines a pair of openings 222 at opposite ends thereof. The bracket member 24 includes a pair of sidewalls 242 and a pair of bottom walls 244 disposed at opposite ends thereof. A pair of abutting portions 246 (See FIG. 3) extends upwardly from the respective bottom walls 244 of the bracket member 24. Each locking member 26 has an arc-shaped spring portion 264 extending inwardly and downwardly from an upper section thereof, corresponding to one of the abutting portions 246 of the bracket member 24. A hook 268 is formed from the locking member 26 at a lower section thereof, corresponding to one of the retaining holes 14 of the latching legs 12 of the retention module 10. A protruding portion 262, which has an inclined plane 263 formed thereon, extends outwardly from a central section of the locking member 26. The operating member 28 includes a cam 282 formed at a free end thereof.

The cam 282 has a pressing portion 284 formed at a distal end thereof. In assembly, the operating member 28 is pivotably attached to the bracket member 24. Each locking member 26 passes through one of the openings 222 of the supporting member 22 and is pivotably attached to the bracket member 24 with the spring portion 264 abutting on the corresponding abutting portion 246 to maintain the locking member at a releasing position (See FIGS. 4–5). At this stage, the operating member 28 is perpendicular to the bracket member 24 and the protruding portion 262 and the associated inclined plane 263 are located below the corresponding opening 222 of the supporting member 22.

Figure 4:
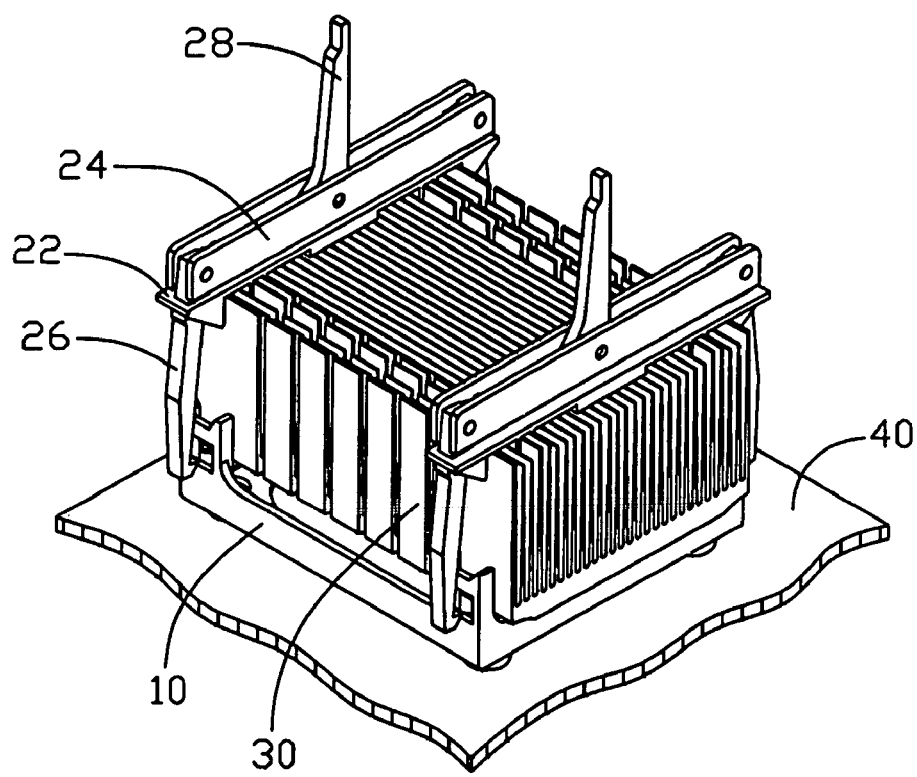
FIG. 4 is an assembled view of FIG. 1 with the retaining device located at a releasing position.
Figure 5:
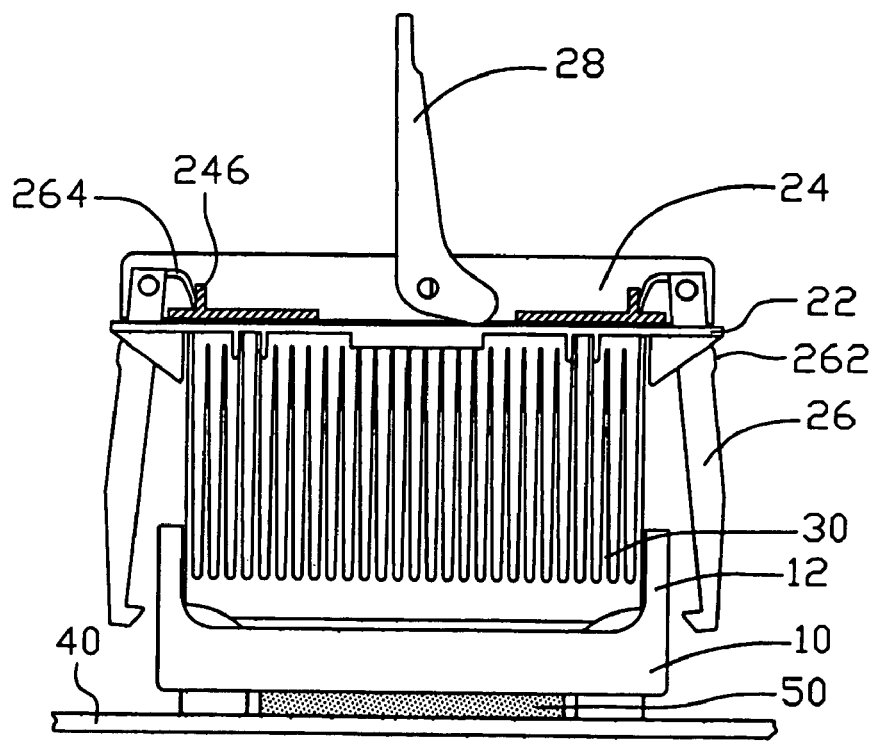
FIG. 5 is a side elevation view of FIG. 4 with a portion of the bracket member cut away for showing in more detail.
Figure 6:
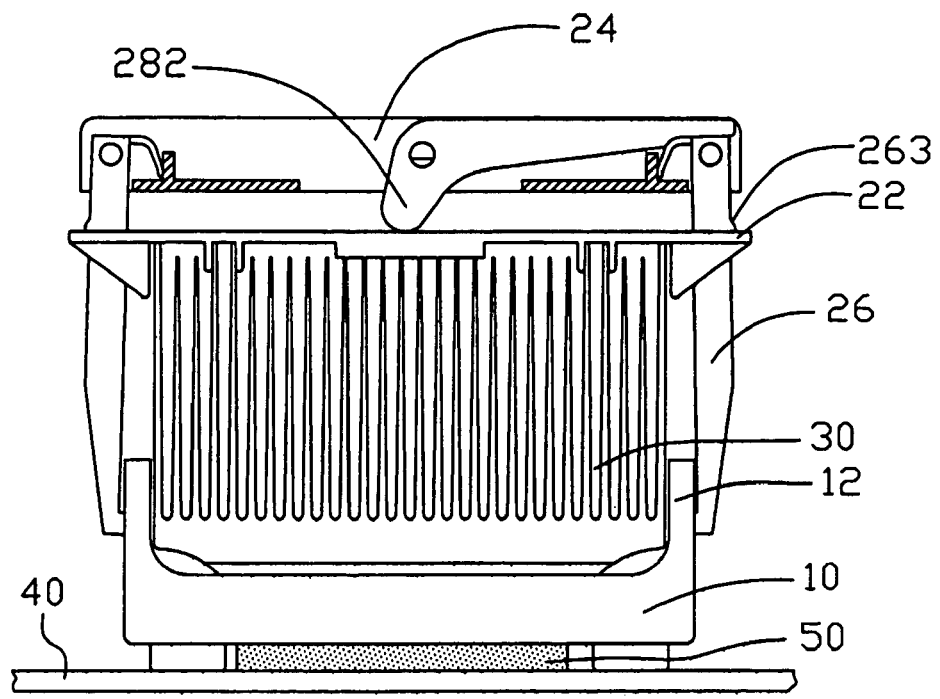
FIG. 6 is similar to FIG. 5, but showing the retaining device located at a locking position.

Referring also to FIGS. 4–6, in operation, the pair of retainers 20 are placed on the heat sink 30 at opposite sides thereof with the locking members 26 confronting with the latching legs 12 of the retention module 10 respectively. Currently, the locking members 26 are located at their releasing positions and the hooks 268 thereof are located far away from the retaining holes 14 of the corresponding latching legs 12. Then, the operating member 28 is pushed to rotate in a clockwise direction (viewed from FIG. 5). The cam 282 of the operating member 28 biases against the supporting member 22 at the top surface thereof to thereby cause the bracket member 24 and the associated locking members 26 to move upward. Meanwhile, the locking members 26 are driven to turn toward each other with the hooks 268 thereof entering into the retaining holes 14 of the corresponding latching legs 12 as the protruding portion 262 and the associated inclined plane 263 of each locking member 26 interferentially passing through the corresponding opening 222 of the supporting member 22. As the operating member 28 continues to turn around until it is received in the space (not labeled) defined between the sidewalls 242 of the bracket member 24, the hooks 268 of the locking members 26 firmly engages with the corresponding latching legs 12 in the retaining holes 14 to maintain the locking members at a locking position (See FIG. 6). The pressing portion 284 of the cam 282 therefore presses on the top surface of the supporting member 22 and exerts a downward force to push the supporting member 22 and the heat sink 30 downwardly. Thus, the heat sink 30 is forced into close contact with the CPU 50 for efficient heat dissipation.

Figure 7:
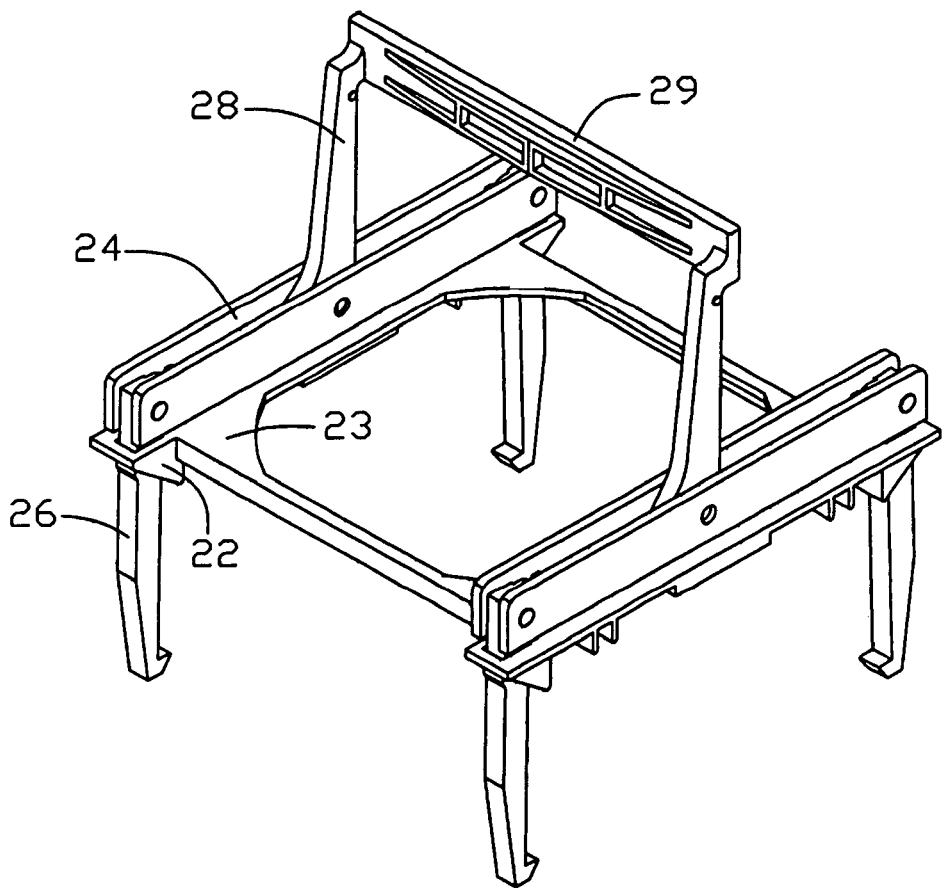
FIG. 7 is an alternative embodiment of the retaining device of FIG. 1.
Figure 8:
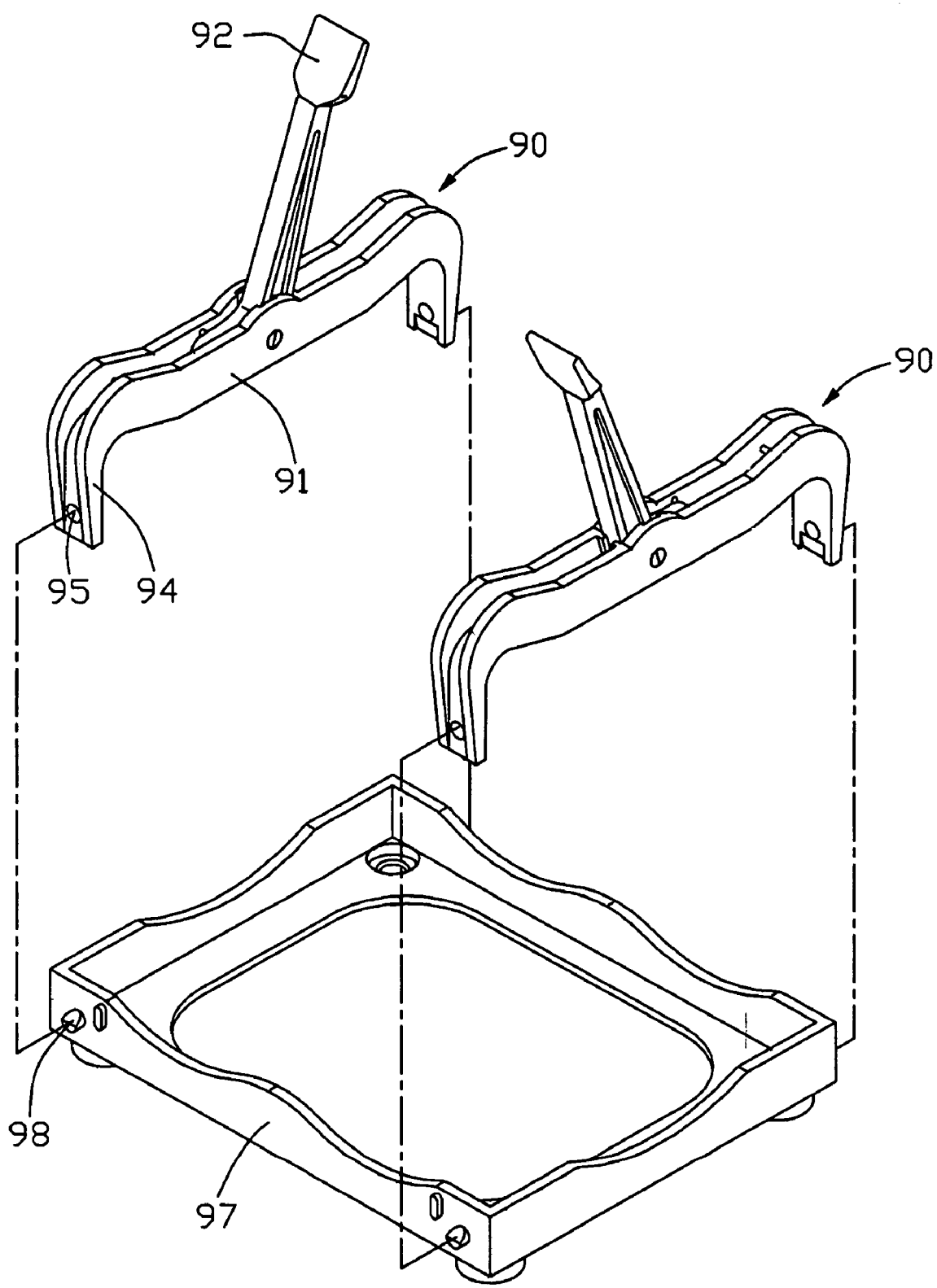
FIG. 8 is an isometric view of a conventional retaining device.

FIG. 7 shows an alternative embodiment of the retaining device according to the present invention. The retaining device is integrated as a whole unit. The top portions of the operating members 28 are connected to each other via a connecting handle 29 to simplify operations. The supporting members 22 are connected to each other via a flat base 23 on which a cooling fan (not shown) is mounted.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. Retainer for a heat sink comprising:
    a supporting member defining a pair of openings at opposite ends thereof;
    a bracket member located above the supporting member and having a pair of abutting portions extending therefrom;
    a pair of locking members respectively extending through the openings of the supporting member and pivotably attached to the bracket member, each locking member having a spring portion abutting against one of said abutting portions to maintain the locking member at a releasing position; and
    an operating member pivotably attached to the bracket member;
    wherein the operating member is pivotable relative to the bracket member to cause the bracket member and the associated locking members to move upward with respect to the supporting member and the supporting member to drive the locking members to turn toward each other to a locking position.

2. The retainer of claim 1, wherein each locking member has a protruding portion extending outwardly adjacent the corresponding opening of the supporting member, the protruding portion having an inclined plane formed thereon for interferentaily passing through said opening and facilitating the movement of the locking device toward said locking position.

3. The retainer of claim 1, wherein the spring portion extends from an upper free end of each locking member.

4. The retainer of claim 3, wherein each locking member has a hook formed at a lower free end thereof.

5. The retainer of claim 1, wherein the bracket member comprises a pair of sidewalls and a pair of bottom walls disposed at opposite sides of the sidewalls.

6. The retainer of claim 5, wherein the abutting portions extend from the respective bottom walls of the bracket member.

7. The retainer of claim 1, wherein the operating member includes a cam pivotably attached to a center portion of bracket member.

8. A heat sink assembly comprising:
    a retention module with a plurality of retention devices;
    a heat sink positioned on the retention module and surrounded by the retention devices;
    a supporting member seated on the heat sink and defining a pair of openings at opposite ends thereof;
    a bracket member located above the supporting member;
    a pair of locking members respectively extending through the openings of the supporting member and pivotably attached to the bracket member, each locking member having a protruding portion formed thereon, the protruding portion having an inclined plane located below a corresponding opening; and
    an operating member pivotably attached to the bracket member;
    wherein the operating member is pivotable relative to the bracket member to cause the bracket member and the associated locking members to move upward which results in the protruding portion and the associated inclined plane interferentially passing though the corresponding opening of the supporting member to drive each locking member to engage with the corresponding retention device of the retention module.

9. The heat sink assembly of claim 8, wherein each locking member has a spring portion biasing against an abutting portion formed at the bracket member.

10. The heat sink assembly of claim 9, wherein the bracket member includes a pair of sidewalls and a pair of spaced bottom walls respectively connected between opposite ends of the sidewalls.

11. The heat sink assembly of claim 10, wherein said abutting portion extends upwardly from the corresponding bottom wall of the bracket member.

12. The heat sink assembly of claim 8, wherein the operating member has a cam pivotably attached to the bracket member for pressing the supporting member when the locking members engage with the retention module.

13. The heat sink assembly of claim 8, wherein each retention device of the retention module defines a retaining hole, each locking member having a hook engageable with the retention device in the retaining hole.

14. A retainer for securing a heat sink to an electronic component to maintain a thermal contact between said heat sink and said electronic component, said retainer comprising:

a bracket member supportively placed on said heat sink;

a supporting member attached to said bracket and movable relative to said bracket;

at least one locking member separably attached to said bracket and extending from said bracket member toward said electronic component, said at least one locking member resiliently movable relative to said bracket member between a first position where an extending section of said at least one locking member is securely engaged beside said electronic component to achieve said securing of said heat sink to said electronic component, and a second position where said extending section of said at least one locking member is freely disengaged, a portion of said at least one locking member engagable with said supporting member; and an operating member attached to said bracket member and movable between a position thereof to urge said supporting member so as to result in engagement of said supporting member and said portion of said at least one locking member and movement of said at least one locking member from said second position to said first position, and another position thereof to release said supporting member so as to result in disengagement of said supporting member and said portion of said at least one locking member and allow resilient movement of said at least one locking member from said first position to said first position.

15. The retainer of claim 14, wherein said supporting member is placed on said heat sink to support said bracket member via said operating member.

16. The retainer of claim 14, wherein said portion of said at least one locking member is a protruding portion protruding therefrom, and an opening is defined on said supporting member and engagable with said protruding portion.

17. The retainer of claim 14, wherein said bracket member has an abutting portion formed against a spring portion of said at least one locking member so as to provide a resilient force to urge said at least one locking member moving from said first position thereof back to said second position thereof.

* * * * *